(12) United States Patent
Hirano et al.

(10) Patent No.: US 6,860,004 B2
(45) Date of Patent: Mar. 1, 2005

(54) METHOD OF MANUFACTURING A THERMALLY CONDUCTIVE CIRCUIT BOARD WITH A GROUND PATTERN CONNECTED TO A HEAT SINK

(75) Inventors: Koichi Hirano, Hirakata (JP); Seiichi Nakatani, Hirakata (JP); Mitsuhiro Matsuo, Moriguchi (JP); Yoshihisa Yamashita, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/309,707

(22) Filed: Dec. 3, 2002

(65) Prior Publication Data

US 2003/0076663 A1 Apr. 24, 2003

Related U.S. Application Data

(62) Division of application No. 09/834,710, filed on Apr. 13, 2001, now Pat. No. 6,522,555.

(30) Foreign Application Priority Data

Apr. 26, 2000 (JP) ........................................ 2000-126519

(51) Int. Cl.[7] ................................................. H05K 3/30
(52) U.S. Cl. ............................. 29/832; 29/827; 29/841; 29/848; 29/855; 29/856
(58) Field of Search .......................... 29/827, 841, 832, 29/848, 855, 856; 361/760, 746, 748, 813, 713; 174/258, 259, 254–257, 51, 78

(56) References Cited

U.S. PATENT DOCUMENTS

| | | | | |
|---|---|---|---|---|
| 4,396,936 A | * | 8/1983 | McIver et al. | ............. 174/252 |
| 5,559,369 A | * | 9/1996 | Newman | ................... 257/668 |
| 5,851,337 A | | 12/1998 | Chen | |
| 5,888,627 A | * | 3/1999 | Nakatani | ..................... 428/209 |
| 6,038,133 A | * | 3/2000 | Nakatani et al. | ............ 361/760 |
| 6,060,150 A | | 5/2000 | Nakatani et al. | |
| 6,143,116 A | | 11/2000 | Hayashi et al. | |

FOREIGN PATENT DOCUMENTS

| | | | | |
|---|---|---|---|---|
| JP | 30-169187 | | 9/1985 | |
| JP | 1-321690 | | 12/1989 | |
| JP | 2-297995 | | 12/1990 | |
| JP | 3-73594 | | 3/1991 | |
| JP | 10-042242 | * | 2/1998 | ........... H01L/23/36 |
| JP | 11-243166 | * | 2/1998 | ........... H01L/23/36 |
| JP | 10-173097 | | 6/1998 | |
| JP | 11-165090 | * | 6/1999 | ......... H01L/23/373 |
| JP | 2000-353772 | * | 11/1999 | ......... H01L/23/373 |

\* cited by examiner

*Primary Examiner*—Carl J. Arbes
*Assistant Examiner*—Tai Van Nguyen
(74) *Attorney, Agent, or Firm*—Merchant & Gould P.C.

(57) ABSTRACT

In a method of manufacturing a thermally conductive circuit board with high heat dissipation, high conductivity and high ground-connection, a sheet-like thermally conductive resin composition containing 70 to 95 wt. % inorganic filler and 5 to 30 wt. % thermosetting resin composition, a lead frame as a wiring pattern, and an electrically conductive heat sink with a metal pole placed therein are superposed, heated and compressed, and thus are combined to form one body. Consequently, a thermally conductive circuit board with a flat surface is obtained in which a grounding pattern is grounded to the heat sink inside the insulating layer. Thus, the grounding pattern and the heat sink can be connected electrically with each other in an arbitrary position inside the insulating layer of the thermally conductive circuit board. The method provides that a part of a lead frame and heat sink are connected not only mechanically, but also electrically, and allows an associated power module size to be reduced and its density to be increased.

3 Claims, 9 Drawing Sheets

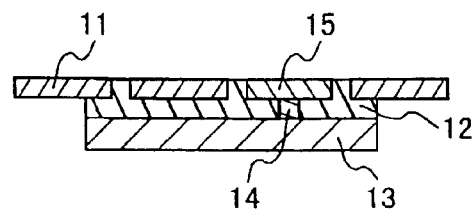
FIG. 1
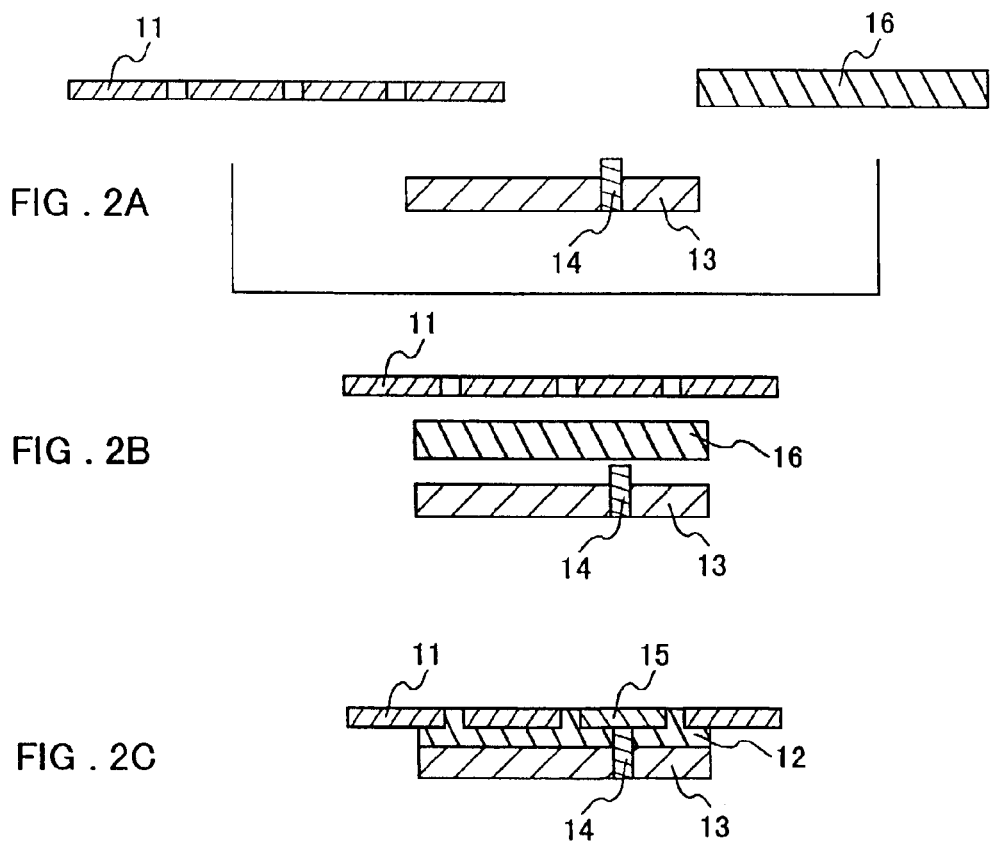
FIG. 2A
FIG. 2B
FIG. 2C

FIG. 11A
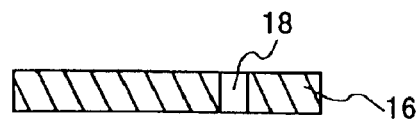
FIG. 11B
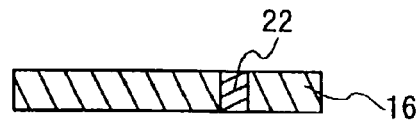
FIG. 11C
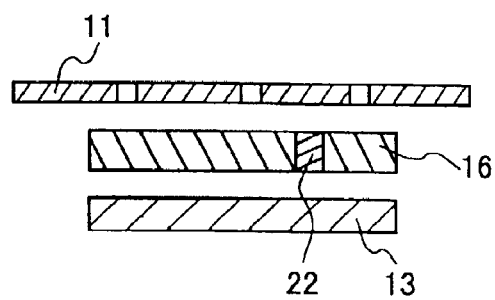
FIG. 11D
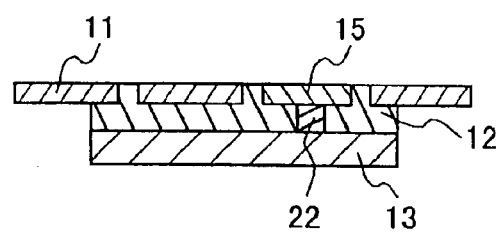
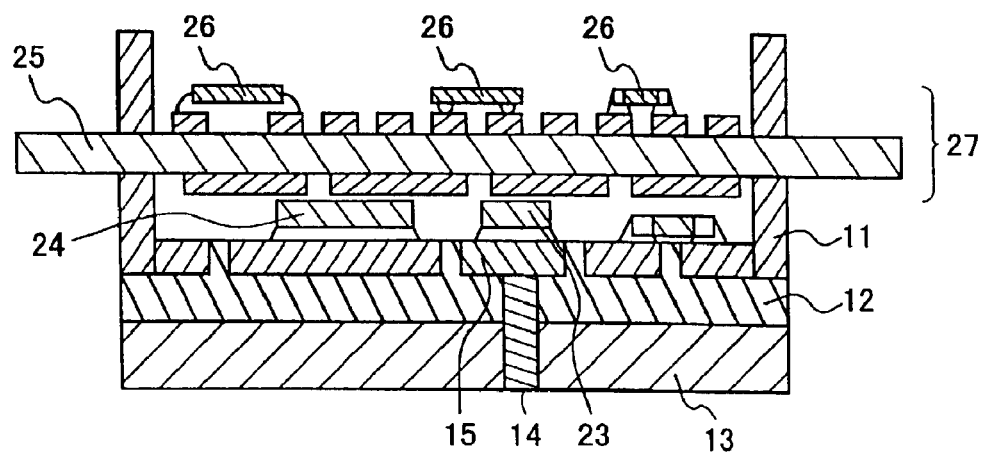
FIG. 12

METHOD OF MANUFACTURING A THERMALLY CONDUCTIVE CIRCUIT BOARD WITH A GROUND PATTERN CONNECTED TO A HEAT SINK

This application is a divisional of application Ser. No. 09/834,710, filed Apr. 13, 2001, now U.S. Pat. No. 6,522,555 which application(s) are incorporated herein by reference.

BACKGROUND OF THE INVENTION

1. Field of the Invention

The present invention relates generally to a circuit board on which various semiconductor devices or electronic components are to be mounted. Particularly, the present invention relates to a resin board (a thermally conductive board) with high heat dissipation that is suitable for use in the power electronics field and to a power module including the same.

2. Related Background Art

Recently, there have been demands for increases in density and improvements in function of semiconductors, as a higher performance and a smaller size are required in electronic equipment. Accordingly, smaller higher-density circuit boards on which such semiconductors are to be mounted also have been required. Hence, a design with consideration to heat dissipation of a circuit board has become important. As a technique of improving heat dissipation of a circuit board, a method employing an insulated metal substrate using a metal plate made of, for example, copper or aluminum instead of a conventional printed board formed of glass-epoxy resin has been known in which a circuit pattern is formed on one surface or both surfaces of the metal plate with an insulating layer interposed therebetween. When higher thermal conductivity is required, a board has been used in which a copper sheet is bonded directly to a ceramic board made of, for example, alumina or aluminum nitride. Generally, an insulated metal substrate is utilized for use with a relatively low power consumption. In this case, the insulated metal substrate is required to have a thin insulating layer to have an improved thermal conductivity. Accordingly, the insulated metal substrate has a problem in that a portion between the circuit pattern and the metal plate as a ground tends to be affected by noise easily, and also has a problem in withstand voltage.

In order to solve such problems, recently, a board has been proposed in which a composition containing a filler with high thermal conductivity added to a resin is combined with a lead frame as an electrode to form one body. For example, JP 10(1998)-173097 A proposes a board including such a composition. A method of manufacturing such a thermally conductive board is shown in FIGS. 15A and 15B. According to JP 10(1998)-173097 A, a mixed slurry containing at least an inorganic filler and thermosetting resin is used to form a film and thus a sheet-like thermally conductive resin composition 16 is produced. The composition 16 is dried and then is superposed with a lead frame 11 and a heat sink 13 as shown in FIG. 15A. Next, as shown in FIG. 15B, they are heated and compressed and the composition 16 is cured to form an insulating layer 12. Thus, a thermally conductive board 28 is produced.

In such a thermally conductive board and a power module including the same, generally a part of the wiring pattern is grounded to the heat sink according to electrical requirements such as reducing stray capacitance. In such a case, it is necessary to connect the wiring pattern and the heat sink outside the board and an additional step other than steps for component mounting is required. FIG. 16 shows an example of the connection with the heat sink in such a case. According to this example, a part of the lead frame 11 is used as a grounding pattern 15 and a lead 29 is soldered to the grounding pattern 15 and the heat sink 13 to establish a ground connection. In the figure, numeral 12 indicates an insulating layer. In order to connect the wiring pattern and the heat sink outside the board, it also is necessary to place the grounding pattern at the periphery of the board. This is a constraint in pattern design, and the degree of freedom in circuit design has been decreased accordingly. Furthermore, there has been a problem in that the size of the board itself increases to allow the establishment of the connection.

SUMMARY OF THE INVENTION

The present invention is intended to solve the aforementioned problems in the conventional technique. It is an object of the present invention to provide a thermally conductive circuit board (hereinafter also referred to as "thermally conductive board") with high heat dissipation, high conductivity, and high ground-connection reliability that are obtained by an electrical connection between a heat sink and a grounding pattern inside an insulating layer of the thermally conductive board and to provide a method of manufacturing the same. In addition, it also is an object of the present invention to provide a power module allowing its size to be reduced and its density increased using the thermally conductive board.

In order to achieve the above-mentioned object, a thermally conductive circuit board of the present invention includes an electrically insulating layer, an electrically conductive heat sink, and a lead frame as a wiring pattern. The electrically insulating layer is formed of a thermally conductive resin composition containing 70 to 95 wt. % inorganic filler and 5 to 30 wt. % resin composition containing at least thermosetting resin. The lead frame and the electrically insulating layer are provided with their surfaces flush with each other. A grounding pattern electrically connected to the heat sink inside the electrically insulating layer is present in an arbitrary position in the same plane as that in which the wiring pattern is formed.

A first method of manufacturing a thermally conductive circuit board with a grounding pattern connected to a heat sink according to the present invention includes:

(1) placing a metal pole in a desired place in an electrically conductive heat sink; and (2) superposing a lead frame as a wiring pattern, a sheet-like thermally conductive resin composition made of 70 to 95 wt. % inorganic filler and 5 to 30 wt. % resin composition containing at least uncured thermosetting resin, and the heat sink sequentially with a portion of the metal pole protruding from the heat sink facing the sheet-like thermally conductive resin composition, and heating and compressing them, so that (A) the metal pole is connected to the lead frame and the sheet-like thermally conductive resin composition is allowed to fill up to a surface of the lead frame or (B) a surface of the metal pole is allowed to be flush with the surface of the lead frame to be a part of the wiring pattern and the sheet-like thermally conductive resin composition is allowed to fill up to the surface of the lead frame, and the thermosetting resin contained in the sheet-like thermally conductive resin composition is cured.

A second method of manufacturing a thermally conductive circuit board with a grounding pattern connected to a heat sink according to the present invention includes:

(1) processing an electrically conductive heat sink by extruding its desired portion to form a protrusion; and (2) superposing a lead frame as a wiring pattern, a sheet-like thermally conductive resin composition made of 70 to 95 wt. % inorganic filler and 5 to 30 wt. % resin composition containing at least uncured thermosetting resin, and the heat sink sequentially with the protrusion of the heat sink facing the sheet-like thermally conductive resin composition, and heating and compressing them, so that (A) the protrusion is connected to the lead frame and the sheet-like thermally conductive resin composition is allowed to fill up to a surface of the lead frame or (B) a surface of the protrusion is allowed to be flush with the surface of the lead frame to be a part of the wiring pattern and the sheet-like thermally conductive resin composition is allowed to fill up to the surface of the lead frame, and the thermosetting resin contained in the sheet-like thermally conductive resin composition is cured.

A third method of manufacturing a thermally conductive circuit board with a grounding pattern connected to a heat sink according to the present invention includes:

(1) placing a metal pole in a desired place in a lead frame as a wiring pattern; and (2) superposing the lead frame, a sheet-like thermally conductive resin composition made of 70 to 95 wt. % inorganic filler and 5 to 30 wt. % resin composition containing at least uncured thermosetting resin, and an electrically conductive heat sink sequentially with a portion of the metal pole protruding from the lead frame facing the sheet-like thermally conductive resin composition, and heating and compressing them, so that the metal pole is connected to the heat sink, the sheet-like thermally conductive resin composition is allowed to fill up to a surface of the lead frame, and the thermosetting resin contained in the sheet-like thermally conductive resin composition is cured.

A fourth method of manufacturing a thermally conductive circuit board with a grounding pattern connected to a heat sink according to the present invention includes:

(1) inserting a metal pole into a desired place in a sheet-like thermally conductive resin composition made of 70 to 95 wt. % inorganic filler and 5 to 30 wt. % resin composition containing at least uncured thermosetting resin; and (2) superposing a lead frame as a wiring pattern, the sheet-like thermally conductive resin composition, and an electrically conductive heat sink sequentially, and heating and compressing them, so that the metal pole is connected to both the heat sink and the lead frame, the sheet-like thermally conductive resin composition is allowed to fill up to a surface of the lead frame, and the thermosetting resin contained in the sheet-like thermally conductive resin composition is cured.

A fifth method of manufacturing a thermally conductive circuit board with a grounding pattern connected to a heat sink according to the present invention includes:

(1) preparing an uncured electrically conductive resin composition containing at least electrically conductive metal powder and thermosetting resin;

(2) making a hole in a desired place in a sheet-like thermally conductive resin composition made of 70 to 95 wt. % inorganic filler and 5 to 30 wt. % resin composition containing at least uncured thermosetting resin and filling the hole with the electrically conductive resin composition; and (3) superposing a lead frame as a wiring pattern, the sheet-like thermally conductive resin composition, and an electrically conductive heat sink sequentially, and heating and compressing them, so that the electrically conductive resin composition is connected to both the heat sink and the lead frame, the sheet-like thermally conductive resin composition is allowed to fill up to a surface of the lead frame, and the thermosetting resins contained in the sheet-like thermally conductive resin composition and the electrically conductive resin composition are cured.

A power module of the present invention includes a thermally conductive circuit board, an active device and a passive device for power, and a control circuit. The thermally conductive circuit board includes an electrically insulating layer, an electrically conductive heat sink, and a lead frame as a wiring pattern. The electrically insulating layer is formed of a thermally conductive resin composition containing 70 to 95 wt. % inorganic filler and 5 to 30 wt. % resin composition containing at least thermosetting resin. The lead frame and the electrically insulating layer are provided with their surfaces flush with each other. A grounding pattern electrically connected to the heat sink inside the electrically insulating layer is present in an arbitrary position in the same plane as that in which the wiring pattern is formed. The active and passive devices for power are mounted on the thermally conductive circuit board. Furthermore, the control circuit is connected thereto for enabling the power module to be controlled.

According to the present invention, a ground connection portion can be provided in a desired position in a wiring pattern of a board including a sheet-like thermally conductive resin composition containing an inorganic filler added to a thermosetting resin composition at a high ratio, an electrically conductive heat sink, and a lead frame as the wiring pattern. Therefore, the degree of freedom in design is improved and a grounding pattern can be provided during the production of the board. Furthermore, since the ground connection outside the board is not required, the size of the board can be reduced. As a result, the grounding pattern and the heat sink can be connected electrically with each other in an arbitrary place inside the insulating layer of the thermally conductive circuit board. Consequently, it is possible to provide a thermally conductive circuit board with high heat dissipation, high conductivity, and high ground-connection reliability, a method of manufacturing the same, and a power module allowing its size to be reduced and its density to be increased.

In addition, according to the methods of manufacturing a thermally conductive circuit board of the present invention, a highly reliable thermally conductive board can be manufactured by a simple method.

Furthermore, according to the power module with a thermally conductive circuit board of the present invention, since ground connection outside the board is not required, the degree of freedom in designing the module is improved and the size of the module can be reduced.

BRIEF DESCRIPTION OF THE DRAWINGS

FIG. 1 is a sectional view showing a thermally conductive board according to an embodiment of the present invention.

FIGS. 2A to 2C show sectional views illustrating respective steps in a method of manufacturing a thermally conductive board according to an embodiment of the present invention.

FIGS. 11A to 11D show sectional views illustrating respective steps in a method of manufacturing a thermally conductive board with an electrically conductive resin composition used to establish a ground connection according to yet another embodiment of the present invention.

FIG. 12 is a sectional view showing a power module according to an embodiment of the present invention.

DETAILED DESCRIPTION OF THE INVENTION

Figure 3:
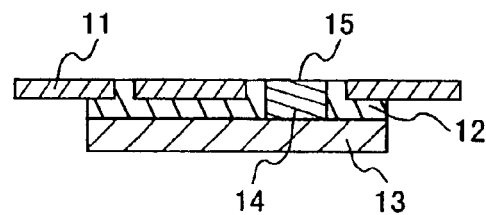
FIG. 3 is a sectional view showing a thermally conductive board with a metal pole surface used as a grounding pattern according to another embodiment of the present invention.

According to the above-mentioned thermally conductive circuit board of the present invention, the grounding pattern can be placed in an arbitrary position in the same plane as that in which the wiring pattern is formed. Therefore, the degree of freedom in pattern design is improved. In addition, the connection inside the insulating layer enables the size of the board to be reduced. Moreover, since the grounding pattern is provided in the same plane as that in which the other pattern is formed, the thermally conductive circuit board is advantageous in component mounting and connection.

According to a preferred example in which the grounding pattern is formed of the lead frame and the grounding pattern and the heat sink are connected electrically with each other inside the electrically insulating layer, the lead frame is used as the grounding pattern. Therefore, a higher degree of freedom in shape is obtained, and component mounting on and connection to the grounding pattern are facilitated.

According to a preferred example in which the grounding pattern and the heat sink are connected electrically with each other through a metal pole embedded in the insulating layer, the use of the metal pole allows a connection portion to have a lower resistance and thus the connection reliability is improved. In addition, a high position accuracy in the thermally conductive circuit board allows the connection reliability to be improved.

According to a preferred example in which the grounding pattern and the heat sink are connected electrically with each other through a cured material of an electrically conductive resin composition containing at least electrically conductive metal powder and thermosetting resin provided in the electrically insulating layer, an electrical connection can be obtained with high accuracy.

According to a preferred example in which the grounding pattern is formed of a part of the heat sink processed to form a protrusion with a flat top, the part of the heat sink can be used as the grounding pattern without requiring any further processing. Therefore, a high connection reliability can be obtained.

According to a preferred example in which the grounding pattern is formed of a top of the metal pole connected to the heat sink, the metal pole for a connection can be used as the grounding pattern without requiring any further processing.

Preferably, the metal pole is fitted in at least one of the lead frame and the heat sink. Furthermore, it also is preferable that at least one end of the metal pole has a two step protrusion.

One end of the metal pole may have a conoidal shape, and the conoidal end of the metal pole may be stuck in one of the heat sink and the lead frame. In this specification, the "conoidal shape" includes a "pyramidal shape".

According to the first method of the present invention, an insulator with a high inorganic filler ratio and excellent thermal conductivity can be handled easily. In addition, a part of the lead frame as the wiring pattern can be used as a grounding pattern in forming the board.

In another method of the present invention, the above-mentioned process (2) is replaced by a step of superposing a lead frame as a wiring pattern, the sheet-like thermally conductive resin composition, and the heat sink sequentially with a portion of the metal pole protruding from the heat sink facing the sheet-like thermally conductive resin composition, and heating and compressing them, so that a surface of the metal pole is made flush with the surface of the lead frame to be a part of the wiring pattern, the sheet-like thermally conductive resin composition is allowed to fill up to the surface of the lead frame, and the thermosetting resin contained in the sheet-like thermally conductive resin composition is cured. According to this method, the metal pole can be used as a connection material and also can be used as the grounding pattern, so that it is no longer necessary to prepare the grounding pattern separately.

In each method of manufacturing a thermally conductive circuit board mentioned above, the process (1) may be replaced by a step of processing an electrically conductive heat sink by extruding its desired portion in a protrusion form. Furthermore, in the process (2), the metal pole may be replaced by a protrusion. In this case, it is no longer necessary to prepare the metal pole. Since a part of the heat sink can be used as the grounding pattern without requiring any further processing or can be connected directly to the lead frame, the connection reliability is improved.

In the first to fourth methods of the present invention, it is preferable that a hole with a slightly smaller diameter than that of the metal pole is formed in a desired place in at least one of the heat sink and the lead frame and the metal pole is fitted into the hole. This improves the connection reliability.

In each method of manufacturing a thermally conductive circuit board described above, preferably, an end to be connected to the heat sink or the lead frame of ends of the metal pole or the protrusion has a conoidal shape, and in the process (2), the end with a conoidal shape of the metal pole or the protrusion bites into and is connected to the heat sink or the lead frame. This improves the connection reliability and the position accuracy.

Similarly in the fifth method of the present invention, the grounding pattern can be provided in an arbitrary place in a wiring pattern.

In the power module of the present invention, active and passive devices for power are mounted on any one of the thermally conductive circuit boards described above and a control circuit is connected thereto. This configuration can provide a small power module with a high energy density, high heat dissipation, and high degree of freedom in design.

The power module of the present invention is characterized in that components are mounted directly on a grounding pattern that is not included in the wiring pattern of the thermally conductive circuit board.

According to the present invention, since a ground connection portion can be provided in a desired position in the wiring pattern, the degree of freedom in design is improved. In addition, since a pattern for grounding can be provided during the production of the board, the present invention is advantageous in terms of the number of steps. Furthermore, it is not necessary to provide a connection portion outside the board, and therefore the size of the module can be reduced.

The term "power module" used in this specification refers to those with a plurality of semiconductors connected depending on their applications and contained in one package. Examples of the power module include an insulated gate bipolar transistor (IGBT) module, an intelligent power module (IPM), and a DC-DC converter module.

In the present invention, a sheet-like thermally conductive resin composition is used that can be prepared by processing a mixture including a high ratio of inorganic filler added to an uncured thermosetting resin into a sheet form. This thermally conductive resin composition has a high inorganic filler blending ratio and therefore has high thermal conductivity. Consequently, when the thermally conductive resin composition is used as an insulating material in the board, the insulation distance can be increased while high heat dissipation is maintained and thus a board can be manufactured that is excellent in noiseproof and insulation properties, which is an advantage. In addition, the thermally conductive resin composition is characterized in that the cured thermally conductive resin composition has a thermal expansion coefficient close to those of a semiconductor and metal as the wiring pattern and has high reliability with respect to heat history. Since the thermally conductive resin composition has flexibility at ordinary temperatures, it can be handled easily and can be processed by punching or the like. In addition, since it has excellent resin flowability, not only can the thermally conductive resin composition be combined easily with the wiring pattern and the heat sink to form one body, but also the side faces of a thick wiring pattern can be resin-molded. Thus, a board can be manufactured that is excellent in insulating property and in flatness.

Next, embodiments of the present invention are based on the following: the above-mentioned thermally conductive resin composition is heated and compressed together with a lead frame as a wiring pattern and an electrically conductive heat sink, so that they are combined to form one body; the thermally conductive resin composition is allowed to fill openings of the lead frame to form a flush surface; the thermosetting resin contained in the thermally conductive resin composition is cured while the heat sink is allowed to adhere to the thermally conductive resin composition; and thus a rigid board (thermally conductive board) with excellent heat dissipation is produced.

In a first embodiment of the present invention, during the formation of the thermally conductive board described above, a protrusion such as a metal pole or the like is provided in an arbitrary place in the wiring pattern or the heat sink in advance, the protrusion is placed and superposed to face the thermally conductive resin composition, and the whole is heated and compressed, so that a ground connection is established between the heat sink and a part of the wiring pattern during the formation of the board.

In a second embodiment of the present invention, during the formation of the thermally conductive board described above, a protrusion such as a metal pole or the like is provided in an arbitrary place in the heat sink in advance, the protrusion is placed and superposed to face the thermally conductive resin composition, and the whole is heated and compressed, so that the protrusion is formed as a grounding pattern at the same time the board is formed.

In a third embodiment of the present invention, during the formation of the thermally conductive board described above, a metal pole or an electrically conductive resin composition is inserted into an arbitrary place in a thermally conductive resin composition preformed in a sheet shape so as to go through the sheet-like thermally conductive resin composition, this is superposed with a lead frame as a wiring pattern and a heat sink, they are heated and compressed to be combined to form one body, and a ground connection is established between a part of the wiring pattern and the heat sink.

A fourth embodiment of the present invention is directed to a power module in which active and passive devices for power are mounted on a thermally conductive circuit board formed in one of the embodiments described above and particularly components are mounted directly on the grounding pattern.

In this specification, a thermally conductive mixture includes a thermosetting resin composition and an inorganic filler, and the thermosetting resin composition includes at least thermosetting resin, and a curing agent, a curing accelerator, and various additives. The thermally conductive mixture has a thermal conductivity of 2 to 15 W/mK. With respect to the maximum thermal conductivity of the inorganic filler, for example, $Al_2O_3$ and AlN have maximum thermal conductivities of 30 W/mK and 200 W/mK, respectively. The minimum amount of the thermosetting resin in the thermosetting resin composition is 30 wt. %. In addition, the heat sink has a maximum resistivity of 30 $\mu\Omega\cdot$cm (=0.3 $\mu\Omega\cdot$m), and the electrically conductive resin composition also has a maximum resistivity of 30 $\mu\Omega\cdot$cm (=0.3 $\mu\Omega\cdot$m) after cured.

Methods of manufacturing a thermally conductive board and a power module according to the embodiments of the present invention are described with reference to the drawings as follows.

FIG. 1 is a sectional view of a thermally conductive board provided with a grounding pattern according to an example of the present invention. In the drawing, numeral 11 indicates a lead frame as a wiring pattern, numeral 12 an insulating layer made of a mixture of 70 to 95 wt. % inorganic filler and 5 to 30 wt. % resin composition containing at least thermosetting resin, numeral 13 an electrically conductive heat sink, numeral 14 a metal pole, and numeral 15 a grounding pattern. The grounding pattern 15 and the heat sink 13 are connected with each other inside the insulating layer 12 through the metal pole 14.

FIGS. 2A to 2C show sectional views illustrating respective steps in a method of manufacturing a thermally conductive board according to an example of the present invention. In FIG. 2A, numeral 11 indicates a lead frame, numeral 16 a sheet-like thermally conductive resin composition obtained by formation of a film with a mixture of 70 to 95 wt. % inorganic filler and 5 to 30 wt. % resin composition containing at least uncured thermosetting resin, numeral 13 an electrically conductive heat sink, and numeral 14 a metal pole. As shown in FIG. 2A, the metal pole 14 is inserted in the heat sink 13 and protrudes from the surface of the heat sink 13. The above-mentioned members are superposed as shown in FIG. 2B and then are heated and compressed. Thus, as shown in FIG. 2C, the thermally conductive resin composition 16 fills openings of the lead frame 11 to provide a flush surface. At the same time, the thermosetting resin contained in the thermally conductive resin composition 16 is cured, and thus an insulating layer 12 is obtained and is combined with the lead frame 11 and the heat sink 13 to form one body. In this state, the metal pole 14 is connected to the grounding pattern 15 in the lead frame 11 as a wiring pattern. Consequently, a thermally conductive board with a grounding pattern is completed.

The "lead frame" in this case refers to those formed to be one body with a metal plate processed to have a wiring pattern shape and respective wiring patterns connected with each other using an outer frame as a part of the metal plate. The lead frame is not particularly limited as long as it is made of a low-electric-resistance metal. For example, copper, iron, aluminum, nickel, or alloys thereof can be used for the lead frame. In addition, for instance, a method employing chemical etching or punching with a die can be used as the pattern formation method. Preferably, the surface of the lead frame is plated for the purpose of improving antioxidation and solder wettability properties. For example, nickel, tin, solder, gold, silver, palladium, chromium, or alloys containing them as a main component can be used as a plating material.

Preferably, the inorganic filler is contained in the thermally conductive resin composition in a ratio in the range of 70 to 95 wt. %. When the ratio of the inorganic filler is lower than the range, the thermal conductivity of the thermally conductive resin component decreases and this causes excessively high heat resistance of the board. Consequently, it becomes difficult to dissipate heat generated from an active device mounted on the board to the outside. Thus, the reliability of the device deteriorates. In addition, the thermal expansion coefficient of the thermally conductive resin composition increases and this increases the difference in thermal expansion coefficient between the thermally conductive resin composition and components such as a semiconductor or metal portion such as a wiring pattern. As a result, the reliability deteriorates. On the contrary, higher ratios of the inorganic filler than the range cause the dete-riorations in insulation property and in adhesiveness between the thermally conductive resin composition and each of the lead frame and the heat sink.

Preferable inorganic fillers include those containing, as a main component, powder of at least one selected from $Al_2O_3$, AlN, SiC, $Si_3N_4$, MgO, $SiO_2$, and BN, since they are excellent in thermal conductivity and electrical insulation property and enable a board with high heat dissipation to be manufactured. Particularly, when $Al_2O_3$ or $SiO_2$ is used, it can be mixed with the resin component easily. The use of AlN allows the thermally conductive board to have a particularly high heat dissipation. Furthermore, it is preferable that the inorganic filler has a grain size in the range of 0.1 to 100 μm, since inorganic fillers having larger or smaller grain sizes than those in the above-mentioned range cause deterioration in the filling property of the filler and in the heat dissipation of the board. Particularly, in order to obtain an excellent filling property of the inorganic filler, it is preferable to blend powders with various grain sizes in the above-mentioned range to provide a high-density filling configuration.

Preferably, the main component of the thermosetting resin contained in the thermosetting resin composition is at least one selected from epoxy resin, phenolic resin, and cyanate resin, since these resins are excellent in heat resistance, mechanical strength, and electrical insulation. Particularly, it is preferable that the resin composition contains brominated polyfunctional epoxy resin as the main component, and further contains bisphenol A-type novolac resin as a curing agent and imidazoles as a curing accelerator. This is because this configuration is excellent not only in heat resistance but also in flame retardancy.

It is preferable that at least one selected from a coupling agent, a dispersant, a coloring agent, and a mold releasing agent further is added to the resin composition. The coupling agent is preferable in that it improves the bond strength between the thermosetting resin and each of the inorganic filler, the lead frame, and the heat sink, and the withstand voltage of the board. For instance, an epoxysilane-, aminosilane-, or titanate-based coupling agent can be used as the coupling agent. The dispersant is preferable in that it improves the dispersibility of the inorganic filler contained in the thermally conductive resin component and homogenizes the inorganic filler. For example, phosphate ester can be used as the dispersant. The coloring agent is preferable in that it colors the thermally conductive resin composition to allow its heat radiation to be improved. For instance, carbon can be used as the coloring agent.

The film formation method for forming the thermally conductive resin composition in a sheet form is not particularly limited. A doctor blade method, a coating method, an extrusion process, or the like can be used as the film formation method. A solvent may be mixed with the thermally conductive resin composition to adjust the viscosity thereof and then may be dried at a lower temperature than a curing temperature of the thermosetting resin contained in the thermally conductive resin composition, and thus the thermally conductive resin composition may be formed in a sheet form. In this case, preferably, the doctor blade method is used, since it permits easy film formation. As the solvent, for example, methyl ethyl ketone (MEK), toluene, or isopropanol can be used.

For instance, aluminum, copper, iron, nickel, or alloys thereof can be used for the electrically conductive heat sink. In addition, any metals can be used for the metal pole as long as they are excellent in electrical conductivity. For example, aluminum, copper, iron, nickel, or alloys thereof can be used for the metal pole. Particularly, it is preferable that the metal pole is made of the same material as that of the electrically conductive heat sink, since in this case, the heat sink and the metal pole have an identical thermal expansion coefficient and therefore a poor connection does not tend to occur easily between the heat sink and the metal pole due to temperature changes.

FIG. 3 is a sectional view of a thermally conductive board with a grounding pattern according to another example of the present invention. In the figure, numeral 11 indicates a lead frame as a wiring pattern, numeral 12 an insulating layer formed of a mixture of 70 to 95 wt. % inorganic filler and 5 to 30 wt. % resin composition containing at least thermosetting resin, numeral 13 an electrically conductive heat sink, and numeral 14 a metal pole. This thermally conductive board can be produced by the same method as shown in FIGS. 2A to 2C. However, the metal pole 14 is not in contact with the lead frame 11 and the top of the metal pole 14 is used as a grounding pattern 15 without requiring any further processing.

The same materials as those described with reference to FIG. 2 can be used for the metal pole according to the present embodiment. Preferably, however, a coating film is formed on the top of the metal pole by a plating method or the like to provide excellent solder wettability since the top is used as the grounding pattern. For instance, solder, tin, silver, palladium, or alloys thereof can be used for the coating film.

Figure 4A:
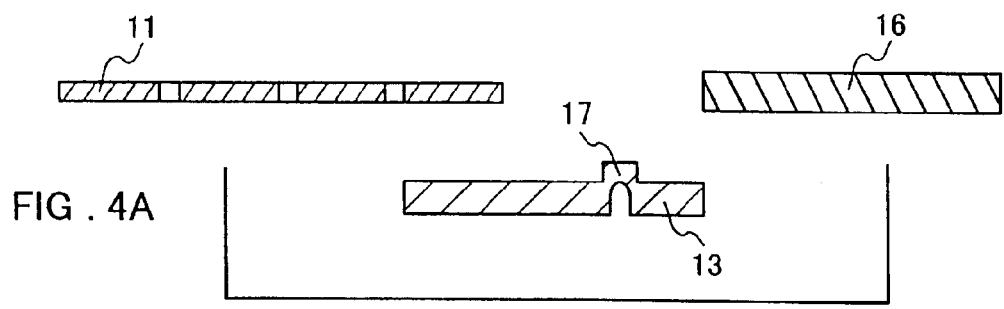
FIGS. 4A to 4C show sectional views illustrating respective steps in a method of manufacturing a thermally conductive board with a protruding portion provided in a metal heat sink to establish a ground connection, according to still another embodiment of the present invention.
Figure 4B:
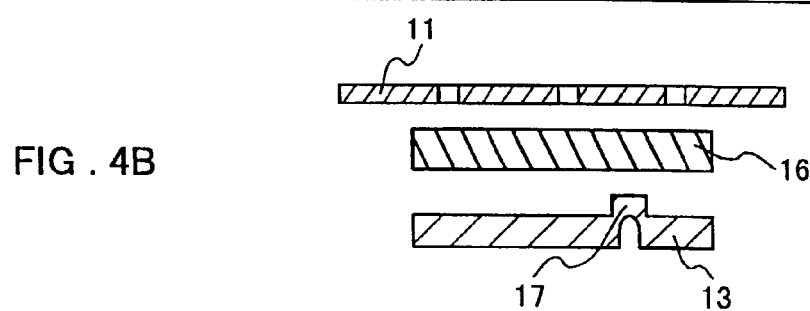
Figure 4C:
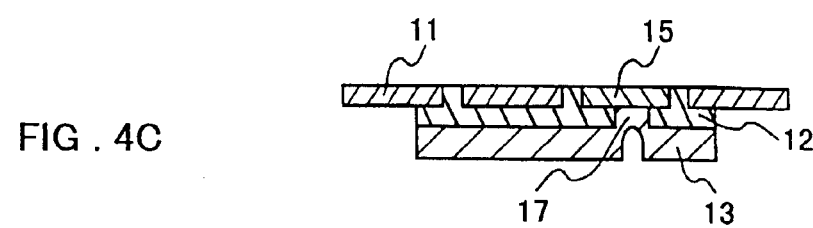

FIGS. 4A to 4C are sectional views showing respective steps in a method of manufacturing a thermally conductive board according to another example of the present invention. In FIG. 4A, numeral 11 indicates a lead frame, numeral 16 a sheet-like thermally conductive resin composition identical with that shown in FIG. 2A, and numeral 13 an electrically conductive heat sink. As shown in FIG. 4A, a part of the heat sink 13 is extruded to be processed into a protrusion shape and thus is formed as a protrusion 17. These members are superposed as shown in FIG. 4B and then are heated and compressed. Thus, as shown in FIG. 4C, the thermally conductive resin composition 16 fills openings of the lead frame 11 to provide a flush surface. At the same time, the thermosetting resin contained in the thermally conductive resin composition 16 is cured, and thus an insulating layer 12 is obtained and is combined with the lead frame 11 and the heat sink 13 to form one body. In this state, the protrusion 17 formed in the heat sink 13 is connected to a grounding pattern 15 in the lead frame 11 as a wiring pattern. Consequently, a thermally conductive board with a grounding pattern is completed.

For example, a punch process, press working, or the like can be used as the method of processing the protrusion.

Figure 5:
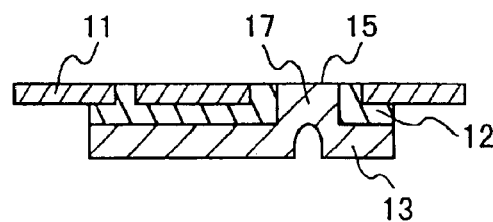
FIG. 5 is a sectional view showing a thermally conductive board with a protruding portion of a heat sink serving as a grounding pattern according to another embodiment of the present invention.

FIG. 5 is a sectional view of a thermally conductive board with a grounding pattern according to still another example of the present invention. In the figure, numeral 11 indicates a lead frame as a wiring pattern, numeral 12 an insulating layer formed of a mixture of 70 to 95 wt. % inorganic filler and 5 to 30 wt. % resin composition containing at least thermosetting resin, numeral 13 an electrically conductive heat sink, and numeral 17 a protrusion formed in the heat sink 13. This thermally conductive board can be produced by the same method as shown in FIGS. 4A to 4C. However, the protrusion 17 is not in contact with the lead frame 11 and the top of the protrusion 17 is used as a grounding pattern 15 without requiring any further processing.

Preferably, a metal coating film with excellent solder wettability is formed on the top of the protrusion 17 by a plating method or the like as in the embodiment shown in FIG. 3 since the top of the protrusion 17 according to the present embodiment is used as the grounding pattern.

Figure 6A:
FIGS. 6A to 6C show sectional views illustrating respective steps in a method of manufacturing a thermally conductive board with a metal pole placed in a lead frame, according to another embodiment of the present invention.
Figure 6A:
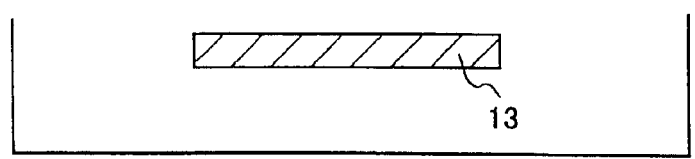
Figure 6B:
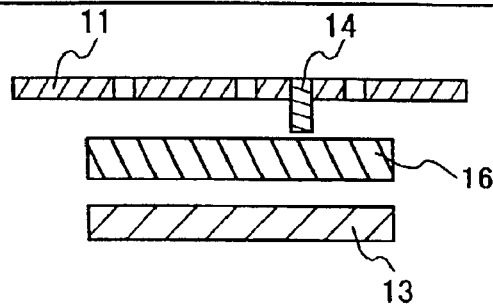
Figure 6C:
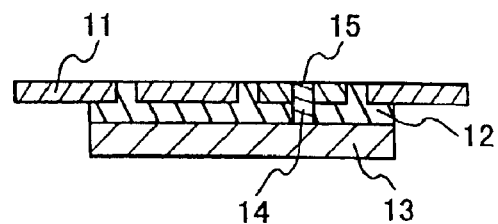

FIGS. 6A to 6C are sectional views showing respective steps in a method of manufacturing a thermally conductive board according to yet another example of the present invention. As shown in FIG. 6A, a metal pole 14 is inserted in a certain pattern of a lead frame 11 as a wiring pattern. Next, as shown in FIG. 6B, the lead frame 11 with the metal pole 14 is superposed with a sheet-like thermally conductive resin composition 16 and an electrically conductive heat sink 13 prepared by the same methods as those used for the composition and the heat sink shown in FIGS. 2A to 2C. Then, they are heated and compressed. Thus, as shown in FIG. 6C, the thermally conductive resin composition 16 fills openings of the lead frame 11 to provide a flush surface. At the same time, the thermosetting resin contained in the thermally conductive resin composition 16 is cured, and thus an insulating layer 12 is obtained and is combined with the lead frame 11 and the heat sink 13 to form one body. In this state, the metal pole 14 provided in the lead frame 11 is connected to the heat sink 13. A part of the lead frame 11 as a wiring pattern serves as a grounding pattern 15. Thus, a thermally conductive board with a grounding pattern is completed.

Figure 7A:
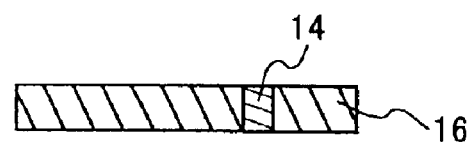
FIGS. 7A to 7C show sectional views illustrating respective steps in a method of manufacturing a thermally conductive board with a metal pole inserted in a sheet-like thermally conductive resin composition, according to still another embodiment of the present invention.
Figure 7B:
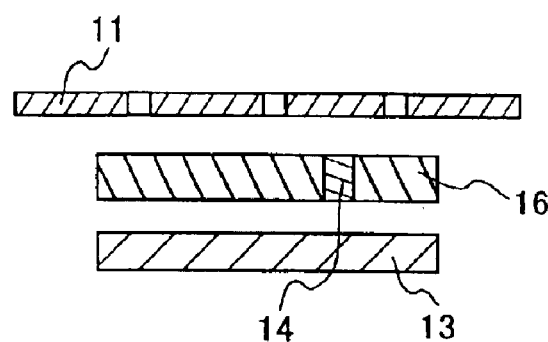
Figure 7C:
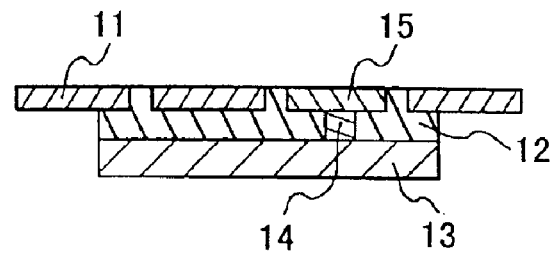

FIGS. 7A to 7C are sectional views showing respective steps in a method of manufacturing a thermally conductive board according to another example of the present invention. As shown in FIG. 7A, a metal pole 14 is embedded in a certain portion of a sheet-like thermally conductive resin composition 16 produced by the same method shown in FIG. 2A. Next, as shown in FIG. 7B, the thermally conductive resin composition 16 with the metal pole 14 embedded therein is superposed with a lead frame 11 as a wiring pattern and an electrically conductive heat sink 13, and then they are heated and compressed. Thus, as shown in FIG. 7C, the thermally conductive resin composition 16 fills openings of the lead frame 11 to provide a flush surface. At the same time, the thermosetting resin contained in the thermally conductive resin composition 16 is cured, and thus an insulating layer 12 is obtained and is combined with the lead frame 11 and the heat sink 13 to form one body. In this state, the metal pole 14 provided in the thermally conductive resin composition 16 is connected to the heat sink 13 and the lead frame 11. A part of the lead frame 11 as the wiring pattern serves as a grounding pattern 15. Thus, a thermally conductive board with a grounding pattern is completed.

Figure 8A:
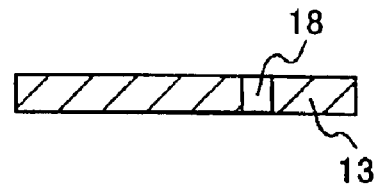
FIGS. 8A to 8C show sectional views illustrating respective steps in a method of fitting a metal pole into a heat sink according to another embodiment of the present invention.
Figure 8B:
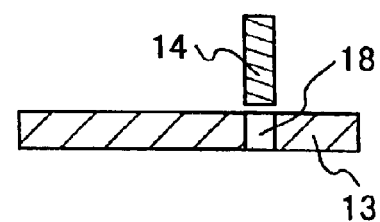
Figure 8C:
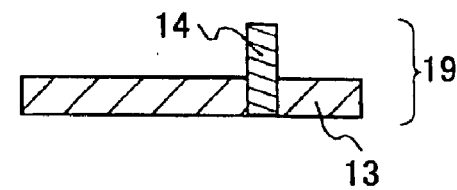

FIGS. 8A to 8C are sectional views showing respective steps in a method of fitting a metal pole into a heat sink according to another example of the present invention. As shown in FIG. 8A, a through hole 18 is provided in an electrically conductive heat sink 13 in an arbitrary place. Next, as shown in FIG. 8B, a metal pole 14 with a slightly larger diameter than that of the through hole 18 is positioned on the through hole 18 and then is fitted into it. Thus, as shown in FIG. 8C, a heat sink with a metal pole 19 is produced. Then, a thermally conductive board provided with a grounding pattern is completed by the same method as shown in FIGS. 2A to 2C.

For example, a hand press or eccentric press can be used as the fitting method. According to this method, a simple and convenient board can be produced that is excellent in connection reliability. Furthermore, a metal pole can be provided in a lead frame by being fitted thereinto by the same method as shown in FIGS. 8A to 8C. In this case, a thermally conductive board is completed by the method as shown in FIGS. 6A to 6C.

Figure 9A:
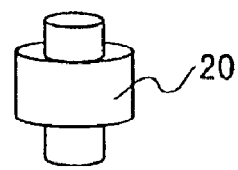
FIGS. 9A to 9E show sectional views illustrating respective steps in a method of manufacturing a thermally conductive board including a metal pole provided with two step protrusions to establish a ground connection according to another embodiment of the present invention.
Figure 9B:
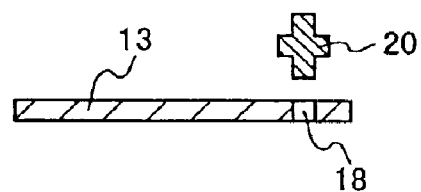
Figure 9C:
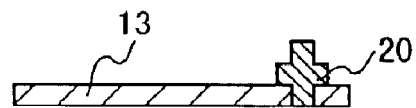
Figure 9D:
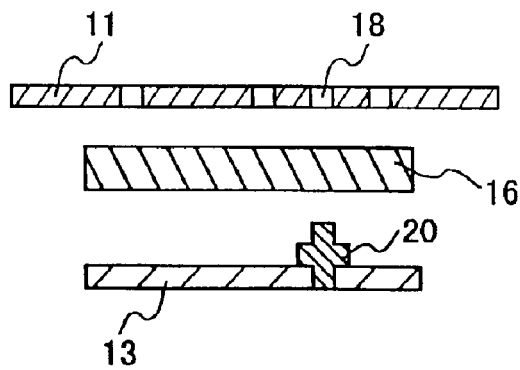
Figure 9E:
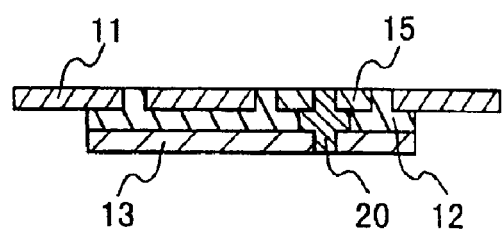

FIGS. 9A to 9E are sectional views showing respective steps in a method of manufacturing a thermally conductive board according to still another example of the present invention. As shown in FIG. 9A, a metal pole 20 with two step protrusions is prepared. Next, as shown in FIG. 9B, this metal pole 20 is positioned on a through hole 18 of an electrically conductive heat sink 13 and then is fitted thereinto. Thus, a heat sink 13 with a metal pole as shown in FIG. 9C is produced. Then, a sheet-like thermally conductive resin composition 16 produced by the same method as in the above-mentioned embodiments and a lead frame 11 as a wiring pattern provided with a through hole 18 are prepared and are superposed on the heat sink 13 with a metal pole. Then, they are heated and compressed. Thus, as shown in FIG. 9E, the thermally conductive resin composition 16 fills openings of the lead frame 11 to provide a flush surface. At the same time, thermosetting resin contained in the thermally conductive resin composition 16 is cured, and thus an insulating layer 12 is obtained and is combined with the lead frame 11 and the heat sink 13 to form one body. In this state, a protrusion of the metal pole 20 provided in the heat sink 13 is connected to the through hole 18 provided in the lead frame 11. A part of the lead frame 11 as the wiring pattern serves as a grounding pattern 15. Thus, a thermally conductive board with a grounding pattern is completed.

FIGS. 9A to 9E show an embodiment in which one protrusion of the metal pole 20 is connected to the lead frame 11. However, the protrusion of the metal pole 20 may not be connected to the lead frame 11 but may be exposed at the board surface and the protrusion itself may be used as the grounding pattern 15. In this case, a constant creeping distance can be maintained to keep the desired electrical insulation between the grounding pattern 15 and the wiring pattern therearound. In addition, since the larger-diameter portion of the metal pole 20 serves as a spacer, the distance between the wiring pattern and the heat sink can be set to be shorter. Thus, this case is preferable, since a higher-density board can be obtained.

In addition, FIGS. 9A to 9E show the metal pole provided with the two step protrusions at both ends. However, the metal pole may be provided with a two step protrusion only at one end. In this case, the protrusion of the metal pole is fitted into a through hole provided in one of the heat sink and the lead frame. Then, a thermally conductive board with a grounding pattern can be produced by the same methods as shown in FIGS. 2A to 2C, FIG. 3, and FIGS. 6A to 6C.

The descriptions with reference to FIGS. 8A to 8C and FIGS. 9A to 9E were directed to embodiments in which a through hole is provided in the heat sink or the lead frame. However, it may not be always necessary for the hole into which the metal pole is to be fitted to go through the heat sink or the lead frame as long as the metal pole can be fitted into the hole.

Figure 10A:
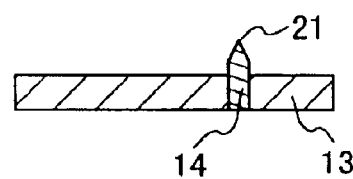
FIGS. 10A to 10C show sectional views illustrating respective steps in a method of manufacturing a thermally conductive board with a metal pole having a conoidal tip according to still another embodiment of the present invention.
Figure 10B:
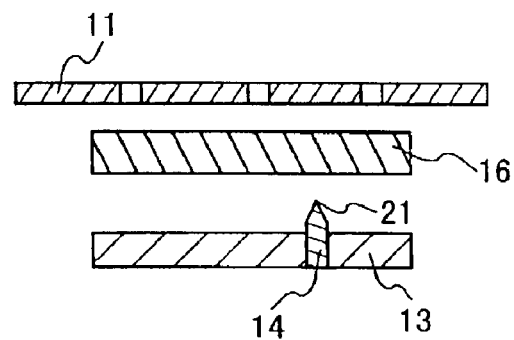
Figure 10C:
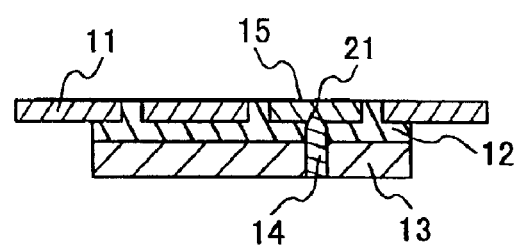

FIGS. 10A to 10C are sectional views showing respective steps in a method of manufacturing a thermally conductive board according to yet another example of the present invention. As shown in FIG. 10A, a metal pole 14 with one end 21 having a conoidal shape is provided in an electrically conductive heat sink 13 by the same method as described with reference to FIGS. 8A to 8C. Next, a lead frame 11 as a wiring pattern and a sheet-like thermally conductive resin composition 16 produced by the same method as in each embodiment described above are prepared and are superposed on the heat sink 13 as shown in FIG. 10B. Then, they are heated and compressed. Thus, thermosetting resin contained in the thermally conductive resin composition 16 is cured, and thus an insulating layer 12 is formed and is combined with the lead frame 11 and the heat sink 13 to form one body as shown in FIG. 10C. At the same time, the conoidal end 21 of the metal pole 14 provided in the heat sink 13 sticks into the lead frame 11 to be connected thereto. A part of the lead frame 11 as the wiring pattern serves as a grounding pattern 15. Thus, a thermally conductive board with a grounding pattern is completed.

FIGS. 11A to 11D are sectional views showing respective steps in a method of manufacturing a thermally conductive board according to another example of the present invention. As shown in FIG. 11A, a through hole 18 is formed in an arbitrary place in a sheet-like thermally conductive resin composition 16 produced by the same method as in each embodiment described above. Next, as shown in FIG. 11B, the through hole 18 is filled with an electrically conductive resin composition 22. Then, as shown in FIG. 11C, the thermally conductive resin composition 16, a lead frame 11 as a wiring pattern, and an electrically conductive heat sink 13 are superposed and then are heated and compressed. Thus, thermosetting resin contained in the thermally conductive resin composition 16 is cured, and thus an insulating layer 12 is formed and is combined with the lead frame 11 and the heat sink 13 to form one body as shown in FIG. 11D. At the same time, the electrically conductive resin composition 22 in the through hole 18 provided in the thermally conductive resin composition 16 also is cured and electrically connects the lead frame 11 and the heat sink 13. A part of the lead frame 11 as the wiring pattern serves as a grounding pattern 15. Thus, a thermally conductive board with a grounding pattern is completed.

Materials including electrically conductive metal powder mixed with thermosetting resin can be used as the electrically conductive resin composition. Preferably, the metal powder is made of at least one metal selected from a group consisting of gold, silver, copper, nickel, palladium, tin, and solder, and alloys thereof. This is because such metal powder is excellent in conductivity and has high connection reliability. For instance, an epoxy resin can be used as the thermosetting resin. In addition, it is preferable that the electrically conductive resin composition is mixed in a paste form, since this allows the through hole in the thermally conductive resin component to be filled easily. For example, screen printing can be used as the filling method.

The above-mentioned composition of the electrically conductive resin and filling method using the same are preferable in that not only when the wiring pattern and the heat sink are made of the same material but also when they are made of different materials, the difference in thermal expansion between the respective different materials is compensated and thus a highly reliable electrical connection can be obtained.

In each embodiment described above, when the lead frame, thermally conductive resin composition, and heat sink are superposed and then are heated and compressed to form a board, a portion of the thermally conductive resin composition corresponding to the position where the metal pole or the protrusion is to be provided may be removed in advance. This is because, in this case, the metal pole or protrusion is passed through the thermally conductive resin composition easily and thus, the possibility of deteriorating the conductivity due to presence of the thermally conductive resin composition is reduced. Punching methods with a punch or mold can be used as a method of removing the part of the thermally conductive resin composition.

Furthermore, in each embodiment described above, a plurality of grounding patterns may be provided in a board as required by a circuit. A plurality of methods according to the embodiments described above may be used as the grounding method.

FIG. 12 is a sectional view of a power module including a thermally conductive board according to one of the examples of the present invention. In FIG. 12, the board portion has the same configuration as shown in FIG. 1. Numeral 11 indicates a lead frame as a wiring pattern, numeral 12 an insulating layer formed of a mixture of 70 to 95 wt. % inorganic filler and 5 to 30 wt. % resin composition containing at least thermosetting resin, numeral 13 an electrically conductive heat sink, numeral 14 a metal pole, and numeral 15 a grounding pattern. The grounding pattern 15 and the heat sink 13 are connected inside the insulating layer 12 through the metal pole 14. Parts of the lead frame 11 as the wiring pattern are bent to be orthogonal to the board to form external terminals. An active device 23 and a passive device 24 are mounted on the wiring pattern 11 of this board, and a control circuit board 27 placed thereabove is connected to the lead frame 11 as the wiring pattern and as the external terminals. The control circuit board 27 includes circuit components 26 mounted on a prepared circuit board 25. The circuit portion is sealed with resin and further steps of attaching a case and the like are carried out as required, and thus, a power module is completed. Since such steps can be carried out by known methods, they are not described in detail.

Figure 13:
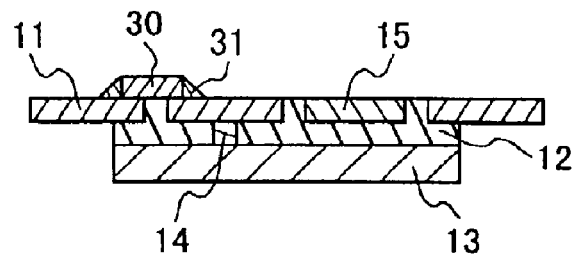
FIG. 13 is a sectional view showing a power module according to another embodiment of the present invention.
Figure 14:
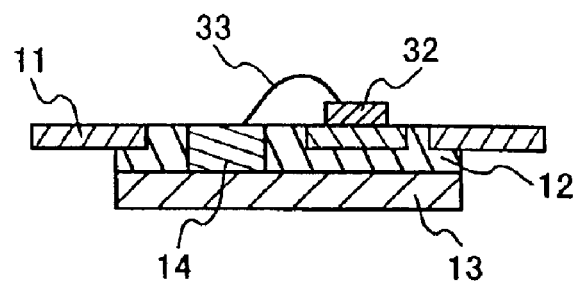
FIG. 14 is a sectional view showing a power module according to still another embodiment of the present invention.
Figure 15A:
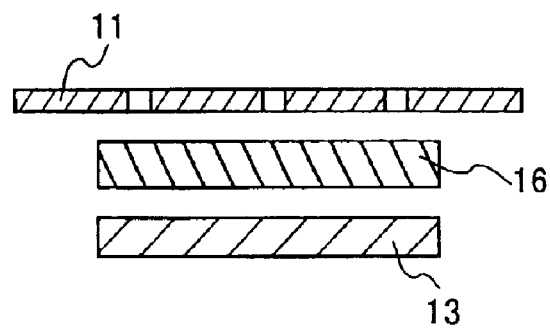
FIGS. 15A and 15B show sectional views illustrating respective steps in a method of manufacturing a conventional thermally conductive board.
Figure 15B:
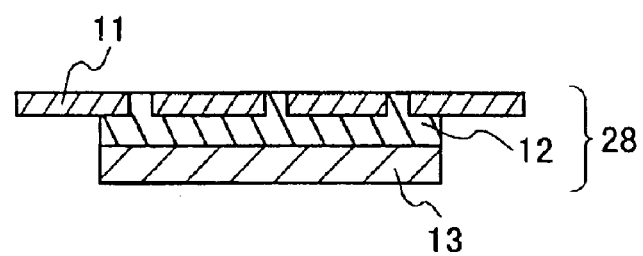
Figure 16:
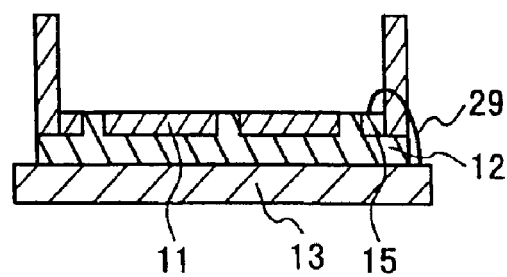
FIG. 16 is a sectional view showing a ground connection method used in a conventional thermally conductive board.

The method of mounting respective components may be selected suitably depending on the types of components. In the case of a surface mounting component as shown in FIG. 13, soldering can be employed. In FIG. 13, numerals 30 and 31 indicate a surface mounting component and a soldering portion, respectively. In the case of a semiconductor bare chip as shown in FIG. 14, a wire bonding method can be employed. In FIG. 14, numerals 32 and 33 indicate a semiconductor device and a metal wire, respectively. In addition, the connection between wiring patterns also may be carried out with a lead wire or a metal bridge in mounting the components.

A general printed circuit board can be used as the circuit board 25 for a control circuit. For example, a glass epoxy board or a phenol board can be used. Furthermore, for example, a method of inserting a board with a control circuit mounted thereon into the external terminals of the thermally conductive board as shown in FIG. 12 can be used as the method of mounting the control circuit on the thermally conductive board.

In the above-mentioned power module, preferably, the components are mounted on the grounding pattern 15, since this allows a small high-density power module to be provided.

Moreover, in FIG. 12, the same configuration as shown in FIG. 1 is used for the thermally conductive board. However, the configuration is not limited to this and each thermally conductive substrate shown in FIGS. 3 to 11D can be used.

EXAMPLES

A thermally conductive board of the present invention, a method of manufacturing the same, and a power module using the same are described further in detail by means of specific examples as follows.

Example 1

In order to produce a sheet-like thermally conductive resin composition used in the present invention, an inorganic filler and a thermosetting resin composition were mixed and processed in a slurry form. The composition of the thermally conductive resin composition thus obtained is described as follows.

(1) Inorganic filler: 89 wt. % $Al_2O_3$ (AS-40, with a mean grain size of 12 μm, manufactured by Showa Denko Co., Ltd.)
(2) Thermosetting resin: 10 wt. % brominated polyfunctional epoxy resin (NVR-1010, containing a curing agent, manufactured by Japan REC Co., Ltd.)
(3) Other additives: 0.5 wt. % curing accelerator (imidazole, manufactured by Japan REC Co., Ltd.), 0.4 wt. % carbon black (manufactured by Toyo-Carbon Co., Ltd.), and 0.55 wt. % coupling agent (Preneact KR-46B, manufactured by Ajinomoto Co., Inc.)

Methyl ethyl ketone (MEK) was added to those materials as a solvent and further alumina balls were added thereto. They were mixed using a ball mill at 800 rpm for 40 hours. The addition of MEK allows the viscosity of the mixture to decrease and the mixture to be processed in a slurry form. However, MEK is allowed to evaporate in the later drying step and therefore is not mentioned in the discussion of the blended composition.

This slurry was applied to a releasing film of polyethylene terephthalate (PET) whose surface had been subjected to a mold-release treatment, to form a film by a doctor blade method. Afterward, the film was dried at 90° C. and thereby the solvent evaporated. Thus, a sheet-like thermally conductive resin composition 16 shown in FIG. 2A was produced. The sheet-like thermally conductive resin composition 16 thus obtained had a thickness of 1.2 mm.

Next, a 0.5-mm thick copper sheet (manufactured by Kobe Steel, Ltd.) was etched by a known method and thus a circuit pattern was formed. The copper sheet with the circuit pattern was nickel-plated and thus a lead frame 11 as shown in FIG. 2A was prepared. Furthermore, a 1-mm thick aluminum sheet 13 was prepared. A through hole with a diameter of 1.45 mm was formed in a part of the aluminum sheet 13. Then, an aluminum column with a diameter of 1.50 mm and a length of 2.0 mm was fitted into the through hole as shown in FIGS. 8A to 8C. Thus, a heat sink 13 with a metal pole 14 as shown in FIG. 2A was prepared.

The members thus prepared were superposed as shown in FIG. 2B and then were heated and compressed at a temperature of 150° C. under a pressure of 3 MPa for 10 minutes. As a result, the metal pole 14 provided in the aluminum heat sink 13 was connected to the lead frame 11 through the sheet-like thermally conductive resin composition 16. At the same time, openings of the lead frame were filled with the thermally conductive resin composition by the compression, and thus a flush surface was obtained. In addition, the thermosetting resin was cured by the heating and thus an insulating layer was formed. Then, the insulating layer, lead frame, and heat sink were combined to form one body. Consequently, a rigid board (with a thickness of 2.5 mm) as shown in FIG. 2C was completed.

The resistance values of the heat sink 13 and the grounding pattern 15 in the board were measured and as a result, were not higher than 0.1Ω. Furthermore, in order to evaluate connections in the board, the board was passed through a reflow device whose peak temperature was 240° C. ten times and then the resistance values were measured again. As the measurement result, no variation was found. Even after thermal cycle tests at −40 to 125° C. repeated 500 times, no variation in the resistance values was found. This proved the high connection reliability of the grounding pattern.

Example 2

The following description is directed to an example of a thermally conductive board in which the surface of a metal pole inserted in a heat sink is used as a grounding pattern.

A sheet-like thermally conductive resin composition and a lead frame produced by the same methods as in Example 1 were prepared. In addition, a 3-mm thick aluminum sheet was prepared and a recessed portion with a 2 mm×2 mm square shape and a depth of 1.5 mm was provided in a part of the aluminum sheet. An aluminum metal pole having a length of 3 mm with a two step protrusion at its one end was prepared. The protrusion had a length of 1.5 mm. The flat surface of the metal pole on which the protrusion was not formed was solder-plated. Next, the two step protrusion (2.05 mm×2.05 mm square) of the metal pole was fitted into the recessed portion of the aluminum sheet. Thus, a heat sink with a metal pole as shown in FIG. 2A was produced.

The heat sink with a metal pole, the lead frame, and the sheet-like thermally conductive resin composition were superposed as shown in FIG. 2B, and were heated and compressed at a temperature of 150° C. under a pressure of 3 MPa for 10 minutes. Consequently, the metal pole provided in the aluminum heat sink was passed through the sheet-like thermally conductive resin composition and the surfaces of the metal pole and the lead frame were made flush. At the same time, by the compression, openings of the lead frame were filled with the thermally conductive resin composition and thus a flush surface was provided. Furthermore, the thermosetting resin was cured by the heating and thus an insulating layer was formed. This insulating layer, lead frame, and heat sink were combined to form one body. Consequently, a rigid board (with a thickness of 4.5 mm) as shown in FIG. 3 was completed.

The resistance values of the heat sink and the grounding pattern in the board were measured and as a result, were not higher than 0.1Ω. Furthermore, in order to evaluate connections in the board, the board was passed through a reflow device whose peak temperature was 240° C. ten times and then the resistance values were measured again. As the measurement result, no variation was found. Even after thermal cycle tests at −40 to 125° C. repeated 500 times, no variation in the resistance values was found. This proved the high connection reliability of the grounding pattern. In addition, an eutectic solder paste was printed on the grounding pattern, and then the board was passed through the same reflow device as described above. Thus, the solder wettability was evaluated and excellent wettability and no abnormality were found.

Example 3

The following description is directed to an example of a thermally conductive board in which a desired portion of a heat sink was extruded to be processed in a protrusion form and a grounding pattern is connected to the heat sink using the protrusion.

A sheet-like thermally conductive resin composition was produced by the same method as in Example 1. The composition of this thermally conductive resin composition is described as follows.
(1) Inorganic filler: 90 wt. % $Al_2O_3$ (AS-40, with a mean grain size of 12 μm, manufactured by Showa Denko Co., Ltd.)
(2) Thermosetting resin: 9 wt. % cyanate ester resin ("AroCy M30", manufactured by Asahi Ciba Co., Ltd.)
(3) Other additives: 0.4 wt. % carbon black (manufactured by Toyo-Carbon Co., Ltd.), 0.2 wt. % dispersant ("PLYSURF, A-208F", manufactured by Daiichi Kogyo Seiyaku Co., Ltd.), and 0.4 wt. % silane coupling agent (A-187, manufactured by Nippon Unicar Co., Ltd.)

Next, a circuit pattern was formed by punching in a 42-alloy (an alloy with a composition of about 42 wt % nickel-iron) sheet with a thickness of 0.5 mm and was nickel-plated. Thus, a lead frame was prepared. Then, a 0.5-mm thick copper sheet was prepared and a protrusion having a top with a diameter of 2 mm was formed in a predetermined position as shown in FIG. 4A by pressing.

The members thus prepared were superposed and were heated and compressed at a temperature of 170° C. under a pressure of 4 MPa for 50 minutes. As a result, the protrusion provided in the heat sink passed through the sheet-like thermally conductive resin composition and was connected to the lead frame. At the same time, the thermally conductive resin composition filled openings of the lead frame to provide a flush surface. In addition, the thermosetting resin was cured by the heating and thus, an insulating layer was formed. The insulating layer, lead frame, and heat sink were combined to form one body and thus a rigid board (with a thickness of 1.5 mm) as shown in FIG. 4C was completed.

The resistance values of the heat sink and the grounding pattern in the board were measured and as a result, were not higher than 0.1Ω. Furthermore, in order to evaluate connections in the board, the board was passed through a reflow device whose peak temperature was 240° C. ten times and then the resistance values were measured again. As the measurement result, no variation was found. Even after thermal cycle tests at −40 to 125° C. repeated 500 times, no variation in the resistance values was found. This proved the high connection reliability of the grounding pattern.

Example 4

The following description is directed to an example of a thermally conductive board in which a metal pole is embedded in a sheet-like thermally conductive resin composition and is connected to a grounding pattern and a heat sink.

In order to produce the sheet-like thermally conductive resin composition, an inorganic filler and thermosetting resin were kneaded, and thus a clay-like thermally conductive resin composition-was obtained. The composition of the thermally conductive resin composition is described as follows.
(1) Inorganic filler: 35 wt. % AlN (SCAN70, manufactured by the Dow Chemical Company) and 55 wt. % $Al_2O_3$ (AS-40, manufactured by Showa Denko Co., Ltd.)
(2) Thermosetting resin: 9.5 wt. % epoxy resin (XNR5002, manufactured by Nagase-Ciba, Ltd.)
(3) Other additives: 0.3 wt. % silane-based coupling agent (A-187, manufactured by Nippon Unicar Co., Ltd.) and 0.2 wt. % carbon black (manufactured by Toyo-Carbon Co., Ltd.).

These materials were blended and kneaded with a planetary mixer. Thus, a homogeneous composition was obtained and then was processed in a 1.2-mm thick sheet form with a extrusion machine. Consequently, a sheet-like thermally conductive resin composition was produced.

Next, an aluminum metal pole with a diameter of 2 mm and a length of 1.2 mm was produced in which both end portions with a length of 0.1 mm were processed to have a conoidal shape. The metal pole was inserted into the thermally conductive resin composition with a hole punched in a desired position in a predetermined form as shown in FIG. 7A. A lead frame produced by the same method as in Example 1 and a 1.5-mm thick aluminum sheet were prepared.

The members thus prepared were superposed as shown in FIG. 7B and were heated and compressed at a temperature of 170° C. under a pressure of 8 MPa for 60 minutes. Consequently, the metal pole inserted in the sheet-like thermally conductive resin composition was connected to the lead frame and heat sink. At the same time, the thermally conductive resin composition filled openings of the lead frame to provide a flush surface. In addition, the thermosetting resin was cured by the heating and thus, an insulating layer was formed. The insulating layer, lead frame, and heat sink were combined to form one body and thus a rigid board (with a thickness of 3.0 mm) as shown in FIG. 7C was completed.

The resistance values of the heat sink and the grounding pattern in the board were measured and as a result, were not higher than $0.1\Omega$. Furthermore, in order to evaluate connections in the board, the board was passed through a reflow device whose peak temperature was 240° C. ten times and then the resistance values were measured again. As the measurement result, no variation was found. Even after thermal cycle tests at −40 to 125° C. repeated 500 times, no variation in the resistance values was found. This proved the high connection reliability of the grounding pattern. In addition, the portion of the board where the metal pole was embedded was cut and the cutting plane was observed. In this portion, the conoidal portions of the metal pole bit into the lead frame and the heat sink.

Example 5

The following description is directed to an example of a thermally conductive board in which a grounding pattern and a heat sink are connected with each other through an electrically conductive resin composition.

A sheet-like thermally conductive resin composition with a thickness of about 0.7 mm was produced by the same method as in Example 1. A through hole with a diameter of 0.8 mm as shown in FIG. 11A was provided in the sheet-like thermally conductive resin composition by punching. As shown in FIG. 11B, this through hole was filled with an electrically conductive resin composition for via-hole filling by screen printing. The electrically conductive resin composition for via-hole filling was prepared by kneading, using three rollers, 85 wt. % spherical copper metallic particles, 3 wt. % bisphenol A-type epoxy resin (EPICOAT 828, manufactured by Yuka Shell Epoxy Co., Ltd.) and 9 wt. % glycidyl ester epoxy resin (YD-171, manufactured by Toto Kasei) as resin compositions, and 3 wt. % amine adduct curing agent (MY-24, manufactured by Ajinomoto Co., Inc.) as a curing agent. Furthermore, a 0.4-mm thick copper sheet was etched to form a circuit pattern and then was tin-plated. Thus, a lead frame was prepared. In addition, a heat sink formed of a 0.8-mm thick copper sheet was prepared.

These materials were superposed as shown in FIG. 11C and were heated and compressed at a temperature of 180° C. under a pressure of 5 MPa for 10 minutes. Consequently, the thermally conductive resin composition filled openings of the lead frame to provide a flush surface. In addition, the thermosetting resin was cured by heating and thus, an insulating layer was formed. The insulating layer, lead frame, and heat sink were combined to form one body and thus, a rigid board (with a thickness of 1.7 mm) as shown in FIG. 11D was completed. In this case, the electrically conductive resin composition also was cured at the same time the sheet-like thermally conductive resin composition was cured, and was connected to the lead frame and heat sink.

The resistance values of the heat sink and the grounding pattern in the board were measured and as a result, were not higher than $0.1\Omega$. Furthermore, in order to evaluate connections in the board, the board was passed through a reflow device whose peak temperature was 240° C. ten times and then the resistance values were measured again. As the measurement result, no variation was found. Even after thermal cycle tests at −40 to 125° C. repeated 500 times, no variation in the resistance values was found. This proved the high connection reliability of the grounding pattern.

Example 6

The following description is directed to an example of a power module produced using a thermally conductive board according to the present invention.

A power semiconductor device of a TO-220 package (manufactured by Matsushita Electric Industrial Co., Ltd.) and various passive devices such as a capacitor, transformer, choke, resistance or the like were mounted on a wiring pattern of the thermally conductive board produced in Example 2 and were soldered using a reflow device. Afterward, a frame portion of a lead frame was cut and its ends were bent to be orthogonal to the board, thus forming lead-out electrodes. Consequently, a power circuit board with a power circuit mounted thereon was completed.

Further, various ICs and passive components were surface-mounted on a glass epoxy board having four wiring layers and thus a control circuit board with a driving circuit and a protection circuit formed therein was produced. In this control circuit board, through holes were formed in places corresponding to the positions of the lead-out electrodes of the power circuit board.

Then, the control circuit board was inserted into the power circuit board and the lead-out electrodes of the power circuit board were allowed to pass through the through holes in the control circuit board. Afterward, the lead-out electrodes and connection portions of the control circuit board were soldered. Then, a circuit portion was molded with silicone resin (manufactured by Shinetsu Silicone Co., Ltd.) and then was inserted into a case. Thus, a DC-DC converter module as shown in FIG. 12 was completed.

A similar power circuit was formed using a thermally conductive board with no grounding pattern. Since the circuit design requires a part of the lead frame terminal and the heat sink to be connected with each other, the area of the thermally conductive substrate increased by about 1.1 times. Furthermore, it also is necessary to connect a wire for the connection between the grounding pattern and the heat sink. Therefore, the numbers of components and places to be soldered increased. This proves that the thermally conductive substrate connecting the grounding pattern and heat sink inside the insulating layer has an effect on the reductions in processing steps and in size of the module.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A method of manufacturing a thermally conductive circuit board with a grounding pattern connected to a heat sink, where a part of the lead frame and the heat sink are connected electrically, the method comprising: (1) placing a metal pole in a desired place in a lead frame as a wiring pattern; and (2) superposing the lead frame, a sheet-like thermally conductive resin composition made of 70 to 95 wt. % inorganic filler and 5 to 30 wt. % resin composition containing at least uncured thermosetting resin, and an electrically conductive heat sink sequentially with a portion of the metal pole protruding from the lead frame facing the sheet-like thermally conductive resin composition, and heating and compressing them, so that the metal pole is connected to the electrically conductive heat sink, the sheet-like thermally conductive resin composition is allowed to fill up to a surface of the lead frame, and the thermosetting resin contained in the sheet-like thermally conductive resin composition is cured.

2. The method of manufacturing a thermally conductive circuit board according to claim 1, further comprising forming a hole in a desired place in at least one of the electrically conductive heat sink and the lead frame, the hole having a shape corresponding to a shape of the metal pole, and fitting the metal pole into the hole.

3. The method of manufacturing a thermally conductive circuit board according to claim 1, wherein an end of the metal pole to be connected to the electrically conductive hear sink or the lead frame has a conoidal shape, and in the process (2), the end with the conoidal shape of the metal pole bites into and is connected to the electrically conductive heat sink or the lead frame.

* * * * *